(12) United States Patent
Austin et al.

(10) Patent No.: US 7,088,190 B2
(45) Date of Patent: Aug. 8, 2006

(54) VOLTAGE-CONTROLLED OSCILLATORS HAVING CONTROLLING CIRCUITS

(75) Inventors: John S. Austin, Winooski, VT (US); Melissa A. Beacom, Burlington, VT (US); Charles J. Masenas, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 10/709,811

(22) Filed: May 28, 2004

(65) Prior Publication Data
US 2005/0275476 A1    Dec. 15, 2005

(51) Int. Cl.
*H03B 5/24*   (2006.01)

(52) U.S. Cl. .......................... 331/57; 327/149
(58) Field of Classification Search ................ 331/57; 327/149
See application file for complete search history.

(56) References Cited

U.S. PATENT DOCUMENTS 6,271,730 B1 * 8/2001 Abe et al. .................. 331/34
6,278,334 B1 * 8/2001 Schorn ....................... 331/57
2003/0214361 A1 * 11/2003 Nishikido ................... 331/57

* cited by examiner

*Primary Examiner*—Joseph Chang

(74) *Attorney, Agent, or Firm*—Schmeiser, Olsen & Watts; Michael J. LeStrange

(57) ABSTRACT

A voltage-controlled oscillator (VCO) comprising an odd number of delay stage circuits. Each delay stage circuit operates between supply voltages VDD and VSS (VDD>VSS) and comprises (1) an input node, (2) an output node, (3) an inverting circuit, and (4) an electric discharge path coupling the output node to VSS. The electric discharge path includes a switch circuit and a resistance adjusting circuit electrically coupled in series between the output node and VSS. In response to an input signal rising at the input node, the inverting circuit decreases an output signal at the output node, and the electric discharge path opens to help pull the output signal down faster. In response to an input signal falling at the input node, the inverting circuit increases the output signal at the output node, and the electric discharge path closes to minimize its own effect.

17 Claims, 2 Drawing Sheets

VOLTAGE-CONTROLLED OSCILLATORS HAVING CONTROLLING CIRCUITS

BACKGROUND OF INVENTION

1. Technical Field

The present invention relates to voltage-controlled oscillators (VCOs), and more particularly, to voltage-controlled oscillators that consume relatively less power than in the prior art.

2. Related Art

A typical voltage-controlled oscillator can comprise a plurality of delay stages electrically coupled together in series and in a loop. More specifically, the first delay stage generates output signal(s) to the second delay stage. The second delay stage generates output signal(s) to the third delay stage, and so on. Finally, the last delay stage generates output signal(s) back to the first delay stage forming the loop. An output node of any delay stage can be used as the output node of the voltage-controlled oscillator. There is always a need for new designs of voltage-controlled oscillators which have lower power consumption.

In other words, there is a need for novel voltage-controlled oscillators that consume relatively less power than those of the prior art. There is also a need for a method for operating the novel voltage-controlled oscillators.

SUMMARY OF INVENTION

The present invention provides an oscillator delay stage circuit operating between first and second operating voltages, wherein the first operating voltage is higher than the second operating voltage, the oscillator delay stage circuit comprising (a) an inverting circuit including an input node and an output node, wherein the inverting circuit is configured to receive an input signal from the input node and generate an output signal to the output node, and wherein the inverting circuit is further configured to increase the output signal in voltage in response to the input signal decreasing in voltage and to decrease the output signal in voltage in response to the input signal increasing in voltage; and (b) a control circuit including a first switch circuit and a first resistance adjusting circuit electrically coupled in series between the output node and the second operating voltage, wherein in response to the input signal increasing in voltage towards the first operating voltage, the first switch circuit is configured to decrease in resistance, and wherein the first resistance adjusting circuit is configured to receive as input an external control signal and to change in resistance in response to a change of the external control signal.

The present invention also provides an oscillator delay stage circuit operating between first and second operating voltages, wherein the first operating voltage is higher than the second operating voltage, the oscillator delay stage circuit comprising (a) an inverting circuit including an input node and an output node, wherein the inverting circuit is configured to receive an input signal from the input node and generate an output signal to the output node, and wherein the inverting circuit is further configured to increase the output signal in voltage in response to the input signal decreasing in voltage and to decrease the output signal in voltage in response to the input signal increasing in voltage; and (b) a control circuit including a first switch circuit and a first resistance adjusting circuit electrically coupled in series between the output node and the first operating voltage, wherein in response to the input signal decreasing in voltage towards the second operating voltage, the first switch circuit is configured to decrease in resistance, and wherein the first resistance adjusting circuit is configured to receive as input an external control signal and to change in resistance in response to a change of the external control signal.

The present invention also provides a method for signal generation, the method comprising the steps of (a) providing a voltage-controlled oscillator comprising N oscillator delay stage circuits operating between first and second operating voltages, N being an odd integer, the first operating voltage being higher than the second operating voltage, wherein each of the N oscillator delay stage circuits comprises (i) an inverting circuit including an input node and an output node, and (ii) a control circuit including a switch circuit and a resistance adjusting circuit electrically coupled in series between the output node and the second operating voltage; (b) applying to the resistance adjusting circuit an external control signal so as to achieve a target operating frequency for the voltage-controlled oscillator; (c) in response to an input signal rising in voltage at the input node, (i) using the inverting circuit to decrease an output signal in voltage at the output node, and (ii) decreasing the resistance of the switch circuit.

The present invention provides voltage-controlled oscillators consuming less power than those of the prior art.

DETAILED DESCRIPTION

Figure 1:
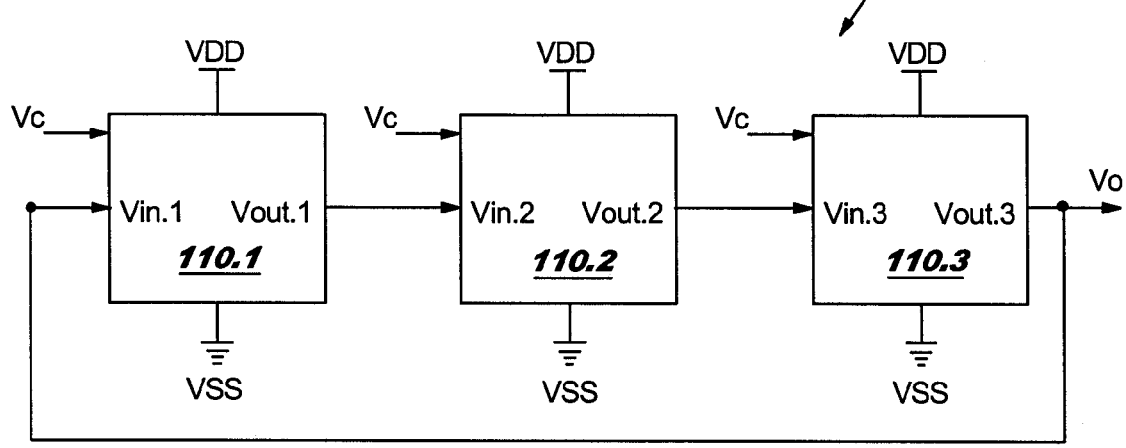
FIG. 1 illustrates a block diagram of a voltage-controlled oscillator comprising multiple delay stage circuits, in accordance with embodiments of the present invention.

FIG. 1 illustrates a block diagram of a voltage-controlled oscillator (VCO) 100 comprising, illustratively, three delay stage circuits 110.1, 110.2, and 110.3, in accordance with embodiments of the present invention. In general, the VCO 100 can comprise any odd number of delay stage circuits. Each of the delay stage circuits 110.1, 110.2, and 110.3 has an input node Vin for receiving an input signal Vin (for simplicity, hereinafter, the same label used to depict a node is also used to depict the signal on that node) and an output node Vout for outputting an output signal Vout. For example, the signal at input node Vin.1 is denoted as signal Vin.1, and the signal at output node Vout.1 is denoted as signal Vout.1.

The delay stage circuits 110.1, 110.2, and 110.3 are electrically coupled together in series and in a loop. More specifically, the output node Vout.1 of the delay stage circuit 110.1 is electrically coupled to the input node Vin.2 of the delay stage circuit 110.2. The output node Vout.2 of the delay stage circuit 110.2 is electrically coupled to the input node Vin.3 of the delay stage circuit 110.3. Finally, the output node Vout.3 of the delay stage circuit 110.3 is electrically coupled to the input node Vin.1 of the delay stage circuit 110.1, forming the loop. The output node Vout.3 of the delay stage circuit 110.3 can be used as an output node Vo of the VCO 100.

Each of the delay stage circuits 110.1, 110.2, and 110.3 is electrically coupled to power supply voltages VDD and VSS (VDD>VSS), and an external control signal Vc. For each of the delay stage circuits 110.1, 110.2, and 110.3, it takes a delay time for a change in Vin to cause a corresponding change in Vout. In one embodiment, this delay time can be adjusted by adjusting Vc. Because the operating frequency of the VCO 100 is determined by the delay times of the delay stage circuits 110.1, 110.2, and 110.3, the operating frequency of the VCO 100 can be adjusted (i.e., controlled) by adjusting Vc.

Figure 2A:
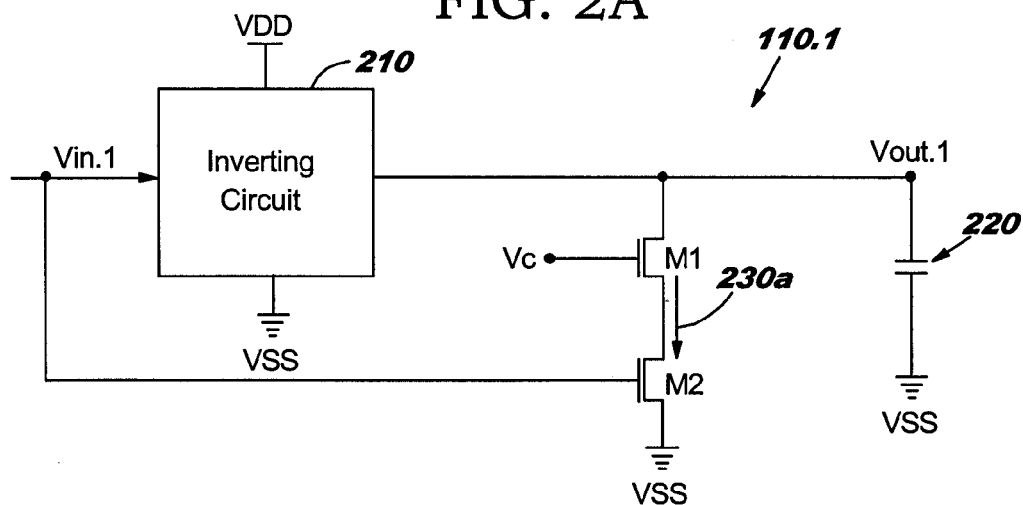
FIGS. 2A–2C illustrate different embodiments for one delay stage circuit of FIG. 1 wherein each embodiment comprises an inverting circuit, in accordance with embodiments of the present invention.
Figure 2B:
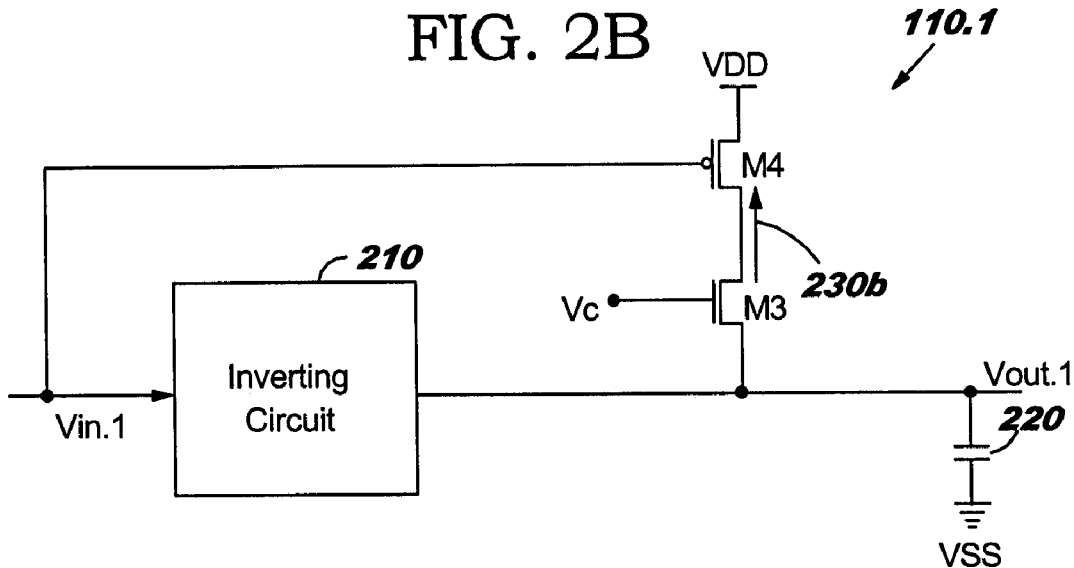
Figure 2C:
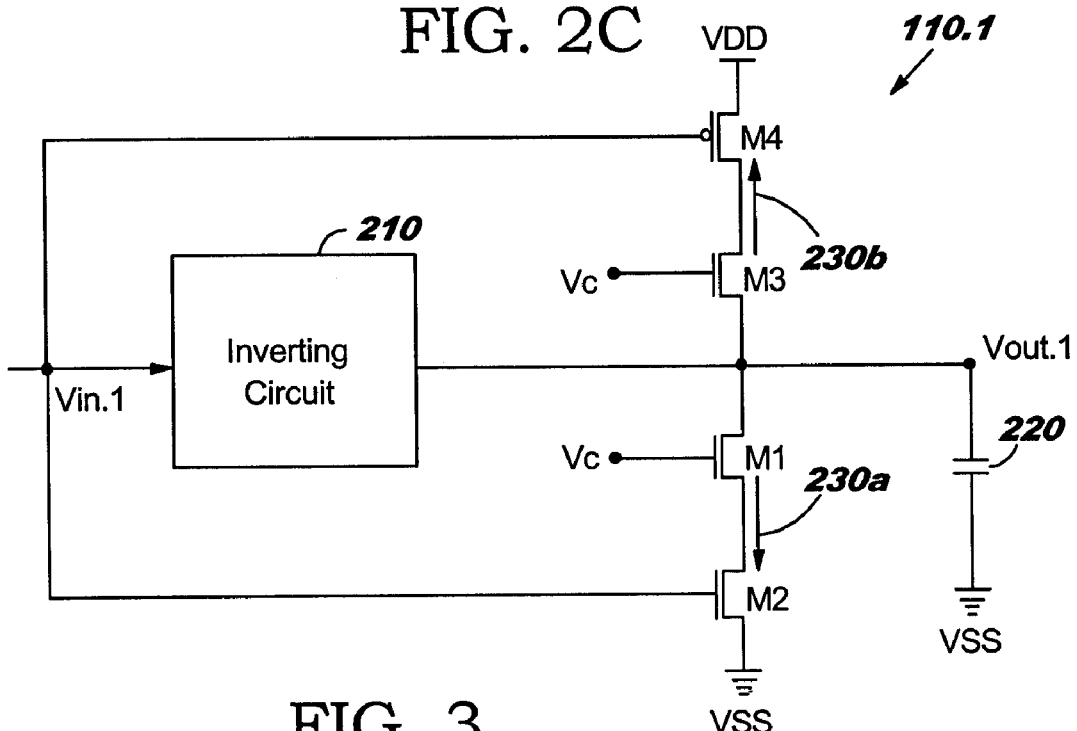

FIGS. 2A–2C illustrate different embodiments for the delay stage circuit 110.1 of FIG. 1, in accordance with embodiments of the present invention. The other delay stage circuits 110.2 and 110.3 can have a similar structure.

In one embodiment as shown in FIG. 2A, the delay stage circuit 110.1 comprises an inverting circuit 210, two n-channel transistors M1 and M2, and an extrinsic capacitor 220. The inverting circuit 210 is electrically coupled to input node Vin.1 and output node Vout.1. The inverting circuit 210 is also electrically coupled to the supply voltages VDD and VSS. In response to signal Vin.1 increasing towards VDD, the inverting circuit 210 is configured to pull signal Vout.1 at node Vout.1 down towards VSS. Also, in response to signal Vin.1 decreasing towards VSS, the inverting circuit 210 is configured to pull signal Vout.1 at node Vout.1 up towards VDD.

The n-channel transistors M1 and M2 are electrically coupled together in series between node Vout.1 and supply voltage VSS. The gate of the n-channel transistor M1 receives control signal Vc, and the gate of the n-channel transistor M2 receives signal Vin.1. The transistors M1 and M2 form an electric discharge path 230a between node Vout.1 and supply voltage VSS.

The extrinsic capacitor 220 is electrically coupled between node Vout.1 and supply voltage VSS. In one embodiment, the extrinsic capacitor 220 can comprise a thin oxide transistor having its gate electrically coupled to node Vout.1 and both of its drain and source electrically coupled to VSS.

Assume that the transistors M1 and M2 and the extrinsic capacitor 220 are omitted in the delay stage circuit 110.1. As a result, the signal propagation delay time (in short, the delay time) of the delay stage circuit 110.1 is determined by the delay time of the inverting circuit 210. The delay time of the delay stage circuit 110.1 is the time it takes delay stage circuit 110.1 to cause a change in signal Vout.1 in response to a change in signal Vin.1.

Assume now that the transistors M1 and M2 are present but the extrinsic capacitor 220 is omitted in the delay stage circuit 110.1. With Vc is fixed at a certain voltage level, when signal Vin.1 rises towards VDD, the inverting circuit 210 pulls signal Vout.1 at node Vout.1 down towards VSS. Also in response to signal Vin.1 rising, transistor M2 becomes more and more conducting. In other words, the resistance of the transistor M2 becomes lower and lower when signal Vin.1 rises towards VDD. As a result, the electric discharge path 230a connecting node Vout.1 to VSS via transistors M1 and M2 becomes more and more conducting. This helps pull signal Vout.1 down towards VSS faster. In other words, the delay time of the delay stage circuit 110.1 is reduced with the presence of the transistors M1 and M2 (i.e., electric discharge path 230a) at least for the time when Vin.1 is rising towards VDD.

When signal Vin.1 falls towards VSS, the inverting circuit 210 pulls signal Vout.1 at node Vout.1 up towards VDD. In response to signal Vin.1 falling, the transistor M1 becomes less and less conducting. In other words, the resistance of the transistor M2 becomes higher and higher when signal Vin.1 falls towards VSS. As a result, the electric discharge path 230a becomes less and less conducting. This helps to minimize the effect of the electric discharge path when signal Vin.1 falls towards VSS. If the transistor M2 were not shut off when Vin.1 falls, supply voltage VSS would strongly pull down on signal Vout.1 via the electric discharge path 230a and therefore slow down the rise of signal Vout.1 towards VDD. In short, the transistor M2 functions as a switch circuit that performs two roles: (i) to open the electric discharge path 230a when Vin.1 is rising so as to help pull Vout.1 down faster, and (ii) to close the electric discharge path 230a when Vin.1 is falling so as to minimize the pull-down effect of the electric discharge path 230a. The total effect is that with the presence of the electric discharge path 230a, the delay time of the delay stage circuit 110.1 is reduced for the time during which Vin.1 is rising. As a result, in total, the presence of the electric discharge path 230a increases the operating frequency of the VCO 100 (FIG. 1).

Because the transistor M1 is on the electric discharge path 230a, changing Vc will adjust the resistance of the electric discharge path 230a. The transistor M1 operates as a resistance adjusting circuit that changes its own resistance in response to the change of Vc. As a result of the presence of the transistor M1, the effect of the electric discharge path 230a (described supra) can be adjusted. More specifically, higher Vc decreases the resistance of the electric discharge path 230a and therefore enhances the effect of the electric discharge path 230a. In other words, increasing Vc reduces the delay time of the delay stage circuit 110.1 and therefore increases the operating frequency of the VCO 100 (FIG. 1).

Assume now that the transistors M1 and M2 (i.e., the electric discharge path 230a) and the extrinsic capacitor 220 are all present in the delay stage circuit 110.1 as shown in FIG. 2A. The function and operation of the electric discharge path 230a are the same as described supra. The extrinsic capacitor 220 is used to adjust the base operating frequency of the VCO 100 (which corresponds to the case in which the electric discharge path 230a is omitted or completely shut off). More specifically, the presence of extrinsic capacitor 220 adds more time to the delay time of the delay stage circuit 110.1 (because it takes time to charge up or discharge the extrinsic capacitor 220), and therefore, decreases the base operating frequency of the VCO 100. If the extrinsic capacitor 220 is a transistor as described supra, the parameters of the transistor (width and length of channel, gate oxide thickness, etc.) determines the capacitance of the extrinsic capacitor 220 and therefore determines the extent of the effect of the extrinsic capacitor 220 to the base frequency of the VCO 100. In other words, the inverting circuit 210 and the extrinsic capacitor 220 can be designed so as to achieve a target base operating frequency of the VCO 100.

FIG. 2B illustrates another embodiment of the delay stage circuit 110.1 of FIG. 1. Compared with the embodiment shown in FIG. 2A, the electric discharge path 230a is replaced by an electric charge-up path 230b comprising an n-channel transistor M3 and a p-channel transistor M4 electrically coupled together in series and between supply voltage VDD and node Vout.1.

The function of the electric charge-up path 230b is similar to that of the electric discharge path 230a (FIG. 2A). However, the difference is that the electric charge-up path 230b helps pull signal Vout.1 up towards VDD in response to falling Vin.1, whereas the electric discharge path 230a helps pull signal Vout.1 down towards VSS in response to rising Vin.1. When Vin.1 rises towards VDD, the electric charge-up path 230b is shut off, just like the electric discharge path 230a is shut off when Vin.1 falls towards VSS (described supra).

As a result of the presence of the electric charge-up path 230b, the delay time of the delay stage circuit 110.1 is reduced for the time during which Vin.1 is falling. Therefore, the presence of the electric charge-up path 230b increases the operating frequency of the VCO 100 (FIG. 1).

Similar to the transistor M2 (FIG. 2A), the transistor M4 functions as a switch circuit that performs two roles: (i) to open the electric charge-up path 230b when Vin.1 is falling so as to help pull Vout.1 up faster, and (ii) to close the electric charge-up path 230b when Vin.1 is rising so as to minimize the pull-up effect of the electric charge-up path 230b.

Similar to the transistor M1 (FIG. 2A), the transistor M3 operates as a resistance adjusting circuit that changes in resistance in response to the change of Vc. As a result of the presence of the transistor M3, the effect of the electric charge-up path 230b can be adjusted. More specifically, higher Vc decreases the resistance of the electric charge-up path 230b and therefore enhances the effect of the electric charge-up path 230b. In other words, increasing Vc reduces the delay time of the delay stage circuit 110.1 and therefore increases the operating frequency of the VCO 100 (FIG. 1).

The function and operation of the inverting circuit 210 and the extrinsic capacitor 220 in FIG. 2B are the same as described supra with respect to FIG. 2A.

FIG. 2C illustrates yet another embodiment of the delay stage circuit 110.1 of FIG. 1. Here, both the electric discharge path 230a and the electric charge-up path 230b are present in the delay stage circuit 110.1. As a result, the delay stage circuit 110.1 of FIG. 2C has the advantages of both embodiments of FIGS. 2A and 2B. In short, when Vin.1 rises, the inverting circuit 210 pulls Vout.1 down. The electric discharge path 230a opens to help pull Vout.1 down faster, whereas the electric charge-up path 230b is closed to minimize the pull-up force from VDD. When Vin.1 falls, the inverting circuit 210 pulls Vout.1 up. The electric charge-up path 230b opens to help pull Vout.1 up faster, whereas the electric discharge path 230a is closed to minimize the pull-down force from VSS.

In addition, adjusting Vc changes the strength of the effects of the electric discharge path 230a and the electric charge-up path 230b. More specifically, higher Vc enhances the effects of both paths 230a and 230b, and therefore reduces the delay time of the delay stage circuit 110.1 of FIG. 2C and therefore increases the operating frequency of the VCO 100 (FIG. 1). Conversely, lower Vc weakens the effects of both paths 230a and 230b, and therefore increases the delay time of the delay stage circuit 110.1 of FIG. 2C and therefore decreases the operating frequency of the VCO 100 (FIG. 1). Given a target operating frequency for the VCO 100, Vc can be adjusted so that the operating frequency for the VCO 100 comes within an acceptable tolerance of the target operating frequency.

The extrinsic capacitor 220 of FIG. 2C helps achieve a target base operating frequency of the VCO 100 (FIG. 1). The extrinsic capacitor 220 can be omitted from the embodiments of FIGS. 2A–2C.

Figure 3:
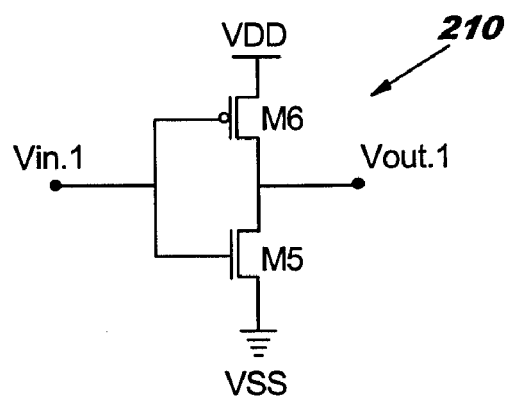
FIG. 3 illustrates one embodiment of the inverting circuit of FIGS. 2A–2C.

FIG. 3 illustrates one embodiment of the inverting circuit 210 of FIGS. 2A–2C. As shown, the inverting circuit 210 comprises an n-channel transistor M5 and a p-channel transistor M6 that are configured to form a CMOS (Complementary Metal Oxide Semiconductor) inverter. The CMOS inverter 210 has its input node and output node electrically coupled to Vin.1 and Vout.1, respectively.

Because CMOS transistors are power efficient, and the paths 230a and 230b are conducting only when necessary to help Vout.1 change faster and are otherwise closed when unneeded, the VCO 100 (FIG. 1) of the present invention is also power efficient.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. An oscillator delay stage circuit operating between first and second operating voltages, wherein the first operating voltage is higher than the second operating voltage, the oscillator delay stage circuit comprising:

(a) an inverting circuit including an input node and an output node,
  wherein the inverting circuit is configured to receive an input signal from the input node and generate an output signal to the output node, and
  wherein the inverting circuit is further configured to increase the output signal in voltage in response to the input signal decreasing in voltage and to decrease the output signal in voltage in response to the input signal increasing in voltage; and (b) a control circuit including (i) a first switch circuit and a first resistance adjusting circuit electrically coupled in series between the output node and the second operating voltage, and (ii) a second switch circuit and a second resistance adjusting circuit electrically coupled in series between the output node and the first operating voltage,
  wherein in response to the input signal increasing in voltage towards the first operating voltage, the first switch circuit is configured to decrease in resistance,
  wherein in response to the input signal decreasing in voltage towards the second operating voltage, the second switch circuit is configured to decrease in resistance,
  wherein the first resistance adjusting circuit is configured to receive as input an external control signal and to change in resistance in response to a change of the external control signal,
  wherein the second resistance adjusting circuit is configured to receive as input the external control signal and to change in resistance in response to a change of the external control signal, and
    wherein the second resistance adjusting circuit comprises a first n-channel transistor.

2. The oscillator delay stage circuit of claim 1, wherein the first switch circuit comprises a second transistor having a gate terminal configured to receive the input signal,
  wherein the first resistance adjusting circuit electrically couples the first switch circuit to the output node, and
  wherein the second resistance adjusting circuit electrically couples the second switch circuit to the output node.

3. The oscillator delay stage circuit of claim 2, wherein the second transistor is an n-channel transistor.

4. The oscillator delay stage circuit of claim 1, wherein the first resistance adjusting circuit comprises a third transistor having a gate terminal configured to receive the external control signal.

5. The oscillator delay stage circuit of claim 4, wherein the third transistor is an n-channel transistor.

6. The oscillator delay stage circuit of claim 1, wherein the inverting circuit comprises a CMOS inverter.

7. The oscillator delay stage circuit of claim 1, wherein the control circuit further comprises an extrinsic capacitor electrically coupled between the output node and the second operating voltage.

8. An oscillator delay stage circuit operating between first and second operating voltages, wherein the first operating voltage is higher than the second operating voltage, the oscillator delay stage circuit comprising:

(a) an inverting circuit including an input node and an output node,
   wherein the inverting circuit is configured to receive an input signal from the input node and generate an output signal to the output node, and
   wherein the inverting circuit is further configured to increase the output signal in voltage in response to the input signal decreasing in voltage and to decrease the output signal in voltage in response to the input signal increasing in voltage; and (b) a control circuit including a first switch circuit and a first resistance adjusting circuit electrically coupled in series between the output node and the first operating voltage,
   wherein in response to the input signal decreasing in voltage towards the second operating voltage, the first switch circuit is configured to decrease in resistance,
   wherein the first resistance adjusting circuit is configured to receive as input an external control signal and to change in resistance in response to a change of the external control signal,
   wherein the first resistance adjusting circuit comprises a first n-channel transistor, and
   wherein the first resistance adjusting circuit electrically couples the first switch circuit to the output node.

9. The oscillator delay stage circuit of claim 8, wherein the first switch circuit comprises a second transistor having a gate terminal configured to receive the input signal.

10. The oscillator delay stage circuit of claim 9, wherein the second transistor is a p-channel transistor.

11. The oscillator delay stage circuit of claim 8, wherein the first n-channel transistor comprises a gate terminal configured to receive the external control signal.

12. The oscillator delay stage circuit of claim 8, wherein the inverting circuit comprises a CMOS inverter.

13. The oscillator delay stage circuit of claim 8, wherein the control circuit further comprises an extrinsic capacitor electrically coupled between the output node and the first operating voltage.

14. A method for signal generation, the method comprising the steps of:

(a) providing a voltage-controlled oscillator comprising N oscillator delay stage circuits operating between first and second operating voltages, N being an odd integer, the first operating voltage being higher than the second operating voltage, wherein each of the N oscillator delay stage circuits comprises:
   (i) an inverting circuit including an input node and an output node, and
   (ii) a control circuit including a switch circuit and a resistance adjusting circuit electrically coupled in series between the output node and the first operating voltage,
   wherein the resistance adjusting circuit comprises a first n-channel transistor;

(b) applying to the resistance adjusting circuit an external control signal so as to achieve a target operating frequency for the voltage-controlled oscillator;

(c) in response to an input signal decreasing in voltage at the input node,
   (i) using the inverting circuit to increase an output signal in voltage at the output node, and
   (ii) decreasing the resistance of the switch circuit.

15. The method of claim 14, wherein the switch circuit comprises a second transistor having a gate terminal configured to receive the input signal, wherein the resistance adjusting circuit electrically couples the switch circuit to the output node.

16. The method of claim 14, wherein the first n-channel transistor comprises a gate terminal configured to receive the external control signal.

17. The method of claim 14, wherein the inverting circuit comprises a CMOS inverter.

* * * * *